(12) United States Patent
Dannenberg et al.

(10) Patent No.: US 10,988,377 B2
(45) Date of Patent: Apr. 27, 2021

(54) METHOD FOR PRODUCING A STRESS-DECOUPLED MICROMECHANICAL PRESSURE SENSOR

(71) Applicant: Robert Bosch GmbH, Stuttgart (DE)

(72) Inventors: Arne Dannenberg, Metzingen (DE); Torsten Kramer, Wannweil (DE); Joachim Fritz, Tuebingen (DE); Thomas Friedrich, Moessingen-Oeschingen (DE)

(73) Assignee: Robert Bosch GmbH, Stuttgart (DE)

( * ) Notice: Subject to any disclaimer, the term of this patent is extended or adjusted under 35 U.S.C. 154(b) by 226 days.

(21) Appl. No.: 16/334,196

(22) PCT Filed: Sep. 18, 2017

(86) PCT No.: PCT/EP2017/073447
§ 371 (c)(1),
(2) Date: Mar. 18, 2019

(87) PCT Pub. No.: WO2018/068991
PCT Pub. Date: Apr. 19, 2018

(65) Prior Publication Data
US 2019/0202687 A1    Jul. 4, 2019

(30) Foreign Application Priority Data
Oct. 14, 2016   (DE) ............... 10 2016 220 077.1

(51) Int. Cl.
*B81C 1/00* (2006.01)
*B81B 7/00* (2006.01)
(Continued)

(52) U.S. Cl.
CPC ........ *B81C 1/00325* (2013.01); *B81B 7/0048* (2013.01); *B81B 7/0061* (2013.01);
(Continued)

(58) Field of Classification Search
CPC ........ B81C 1/00325; B81C 2201/0132; B81C 2201/0112; B81C 2203/035;
(Continued)

(56) References Cited

U.S. PATENT DOCUMENTS

2014/0299948 A1   10/2014 Wang et al.
2016/0122181 A1*  5/2016 Picco .................... G01L 9/0054
                                                                    257/419
2019/0161347 A1*  5/2019 Classen ................. B81B 7/0061

FOREIGN PATENT DOCUMENTS

DE    102004006197 A1    1/2005
DE    102004043356 A1    3/2006
(Continued)

OTHER PUBLICATIONS

International Search Report for PCT/EP2017/073447, dated Dec. 15, 2017.

*Primary Examiner* — Nimeshkumar D Patel
*Assistant Examiner* — Jean F Morello
(74) *Attorney, Agent, or Firm* — Norton Rose Fulbright US LLP; Gerard Messina

(57) ABSTRACT

A method for producing a micromechanical pressure sensor. The method includes: providing a MEMS wafer having a silicon substrate and a first cavity developed therein underneath a sensor diaphragm; providing a second wafer; bonding the MEMS wafer to the second wafer; and exposing a sensor core from the rear side; a second cavity being formed in the process between the sensor core and the surface of the silicon substrate, and the second cavity being developed with the aid of an etching process which is carried out using etching parameters that are modified in a defined manner.

11 Claims, 5 Drawing Sheets

(51) Int. Cl.
  *G01L 19/14*    (2006.01)
  *G01L 19/00*    (2006.01)
  *G01L 9/00*     (2006.01)

(52) U.S. Cl.
  CPC .......... *G01L 9/0042* (2013.01); *G01L 9/0045* (2013.01); *G01L 19/0076* (2013.01); *G01L 19/146* (2013.01); *B81B 2201/0264* (2013.01); *B81B 2203/0127* (2013.01); *B81B 2203/0315* (2013.01); *B81C 2201/0112* (2013.01); *B81C 2201/0132* (2013.01); *B81C 2203/035* (2013.01)

(58) Field of Classification Search
  CPC .... B81B 2201/0264; B81B 2203/0127; B81B 2203/0315; B81B 7/0048; B81B 7/0061; G01L 19/0076; G01L 19/146; G01L 9/0042; G01L 9/0045
  USPC .......................................................... 73/724
  See application file for complete search history.

(56) References Cited

FOREIGN PATENT DOCUMENTS

| | | |
|---|---|---|
| DE | 102015116353 A1 | 5/2016 |
| DE | 102015103485 A1 | 9/2016 |
| DE | 102016211513 A1 | 1/2018 |
| DE | 102016212693 A1 | 1/2018 |

\* cited by examiner

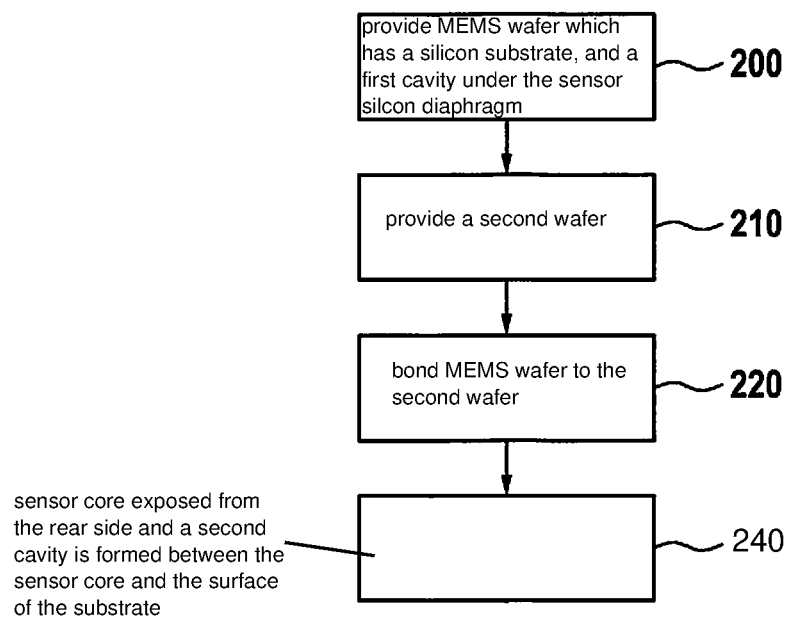

METHOD FOR PRODUCING A STRESS-DECOUPLED MICROMECHANICAL PRESSURE SENSOR

FIELD

The present invention relates to a method for producing a micromechanical pressure sensor. In addition, the present invention relates to a micromechanical pressure sensor.

BACKGROUND INFORMATION

Micromechanical pressure sensors in which a pressure differential as a function of a deformation of a sensor diaphragm is measured are described in German Patent Application No. DE 10 2004 006 197 A1, for example.

Semiconductor resistors, which are used as mechanical-electrical transducers in known micromechanical pressure sensors, not only absorb the mechanical stress that results due to the pressure influence on the diaphragm but also stress that is caused by mechanical disruptive influences. The two most important disruptive influences are the following:
Stress coupled in on account of the packaging due to:
a deformation of the circuit board on which the sensor is mounted,
a deformation of the housing via the temperature, e.g., by soldering,
a temperature behavior of a bonding agent that is used,
intrinsic stress from the sensor element due to the temperature behavior of cover layers.

The mentioned effects are partly able to be managed through a suitable adjustment, e.g., in the dielectric cover layers. The influence of the metallization as well as the stress coupled in via the packaging depends to a considerable extent on the history of the component (e.g., due to creep of the metal, in particular during/following the soldering operation). It is impossible to compensate for this by an adjustment prior to the delivery of the components.

German Patent Application No. DE 10 2015 116 353 A1 describes a micro-integrated encapsulated MEMS sensor featuring a mechanical decoupling, and a method for its production. The pressure sensor produced on an SOI substrate is exposed from the rear side by etching out the buried oxide layer, e.g., with the aid of HF gas-phase etching. The supply of the etching gas is accomplished through access openings that were previously trenched into the silicon of the wafer rear side.

SUMMARY

It is an object of the present invention to provide an alternative production method for a micromechanical pressure sensor featuring an improved operating behavior.

According to a first aspect of the present invention, the objective may be achieved by an example method for producing a micromechanical pressure sensor, the method having the following steps:
Providing a MEMS wafer having a silicon substrate and a first cavity developed therein underneath a sensor diaphragm;
providing a second wafer;
bonding the MEMS wafer to the second wafer;
developing a sensor diaphragm in the silicon substrate; and
exposing a sensor core from the rear side, and developing a second cavity between the sensor core and the surface of the silicon substrate in the process, the second cavity being developed with the aid of an etching process which is carried out using etching parameters that have been modified in a defined manner.

In this way a micromechanical pressure sensor is provided which has a pressure sensor diaphragm that has been exposed on all sides, thereby realizing an efficient stress-decoupling structure. Modifying an etching regimen makes it possible to provide the second cavity within the silicon substrate that is required for this purpose. This simultaneously provides an effective protection against contamination and also creates a media access for the micromechanical pressure sensor. Error signals of the micromechanical pressure sensor are thereby able to be reduced to a considerable extent, which improves an operating characteristic of the pressure sensor. With the aid of the supporting effect of the second wafer, which is bonded to the MEMS wafer, the entire process is able to be comfortably carried out from the rear side.

According to a second aspect of the present invention, the objective may be achieved by an example micromechanical pressure sensor, which has:
a pressure sensor core developed in a silicon substrate and a sensor diaphragm, a first cavity having been developed in the sensor diaphragm;
a second cavity developed above the sensor core in the silicon substrate;
the second cavity having been produced with the aid of an etching process whose etching parameters were modified in a defined manner during the etching process.

Preferred embodiments of the present method for producing a micromechanical pressure sensor are described herein.

According to one advantageous further development of the present method, the etching process for developing the second cavity is a deep reactive ion-etching process having an anisotropic beginning and a defined isotropic continuation. In this way, etching processes that are known per se are advantageously utilized for developing the second cavity.

According to another advantageous further development of the present method, access openings are produced in the silicon substrate in order to develop the second cavity with the aid of a perpendicular etching process. In the process, the perpendicular etching process is changed to a lateral etching process, during which spherical etching fronts that result from the lateral etching process grow together. This advantageously utilizes specific properties of etching processes that are known per se for providing the second cavity. A characteristic of another advantageous further development of the present method is that a passivation and sputter component of the etching process is switched off following the deep reactive ion-etching process. Effective measures are thereby taken to adapt etching processes known per se for the purpose of creating the second cavity.

According to an additional further development of the present method, the entire etching process has a defined isotropic development from the beginning. This advantageously provides an alternative production method.

According to an additional advantageous further development of the present method, trapezoidal etching fronts that widen in a downward direction from the beginning are produced with the aid of the etching process. This advantageously provides a downwardly developed etching regime that widens in a trapezoidal fashion, which therefore advantageously allows for an easier introduction of etching gas. In addition, the etching times are able to be reduced and the entire process can be controlled in a more optimal manner in this way.

According to another advantageous further development of the present method, the second wafer is a passive substrate wafer or an ASIC wafer. This advantageously realizes different options for developing the second wafer.

According to an additional advantageous further development of the present method, the micromechanical pressure sensor is developed as a piezoresistive pressure sensor or as a capacitive pressure sensor. This makes it possible to realize different technological types of micromechanical pressure sensors.

In the following text, the present invention will be described in detail together with further features and advantages on the basis of a plurality of figures. Identical or functionally equivalent elements have been provided with the same reference numerals. The figures are especially meant to illustrate the principles of the present invention and have not necessarily been drawn true to scale. For better clarity, it is possible that not all reference numerals are shown in all of the figures.

Method features similarly result from corresponding described device features, and vice versa. This particularly means that features, technical advantages and specific embodiments pertaining to the present method for producing a micromechanical pressure sensor similarly result from corresponding embodiments, features and technical advantages of the micromechanical pressure sensor, and vice versa.

BRIEF DESCRIPTION OF THE DRAWINGS

FIG. 9 shows a basic sequence of a specific embodiment of a method for producing a micromechanical pressure sensor.

DETAILED DESCRIPTION OF EXAMPLE EMBODIMENTS

The present invention provides an improved production method for a micromechanical pressure sensor. Toward this end, a specifically developed etching method is provided, which is able to be carried out using a simple, cost-effective Si substrate. This results in an efficient stress-decoupling structure, which also realizes a protective device for the micromechanical pressure sensor with regard to external particles or external moisture.

For better clarity, structures or elements that are of no particular importance for the present invention have not been described in the following text.

Figure 1:
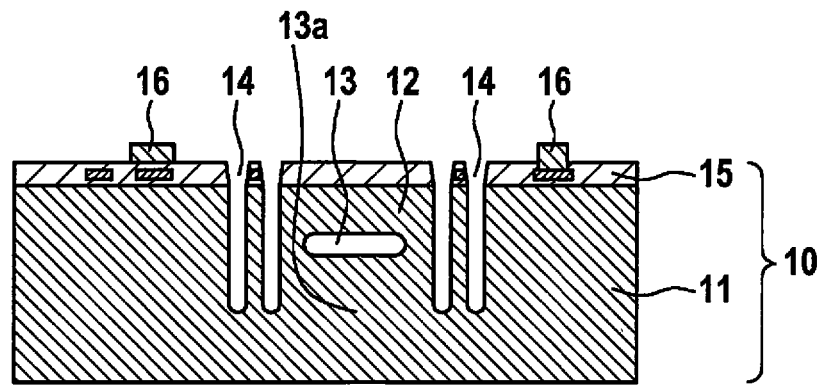
FIGS. 1-4 show cross-sectional views to illustrate the introduced method for producing a micromechanical pressure sensor in accordance with the present invention.

FIG. 1 shows a cross-sectional view of a first wafer 10 having a silicon substrate 11 on which a dielectric cover layer 15 is situated. First access openings 14 and furthermore a first cavity 13 are developed within silicon substrate 11. A bulk silicon 13a is visible underneath first cavity 13. A metallization element 16 is utilized for the subsequent creation of a eutectic bonding connection 20 to a second wafer 30.

Figure 2:
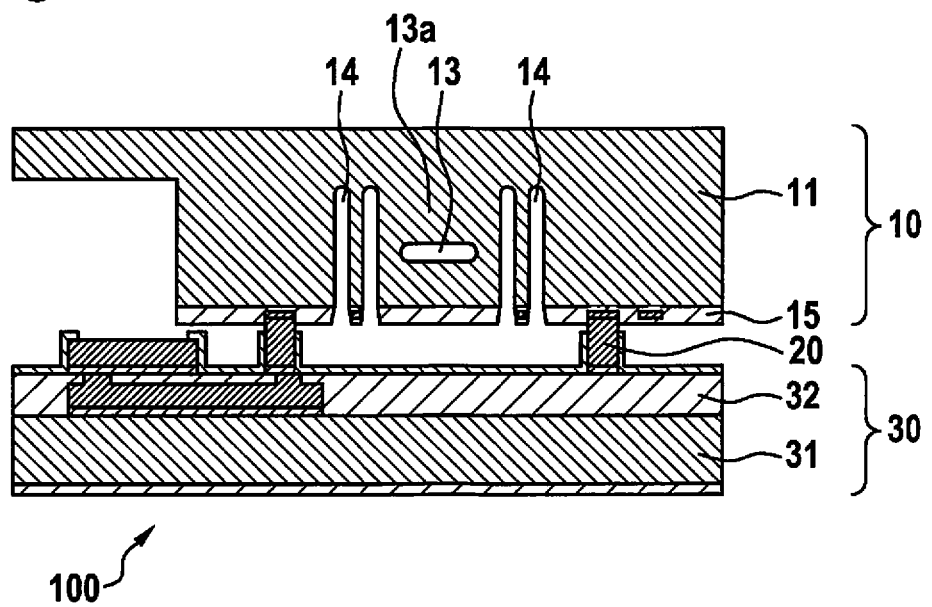

FIG. 2 shows the system from FIG. 1 in a view that is rotated by 180 degrees, in which first wafer 10 is now bonded to a second wafer 30, preferably eutectically, thereby creating a bonding connection 20. Second wafer 30 may be developed as an ASIC wafer or alternatively as a passive substrate wafer (not shown). In the case of an ASIC wafer, second wafer 30 includes an ASIC substrate 31 and a function layer 32 that is disposed thereon. The stack formed in this way is then able to be thinned down again (by grinding, for example) in order to shorten the processing time during the following patterning step and to reduce the height of the component.

Figure 3:
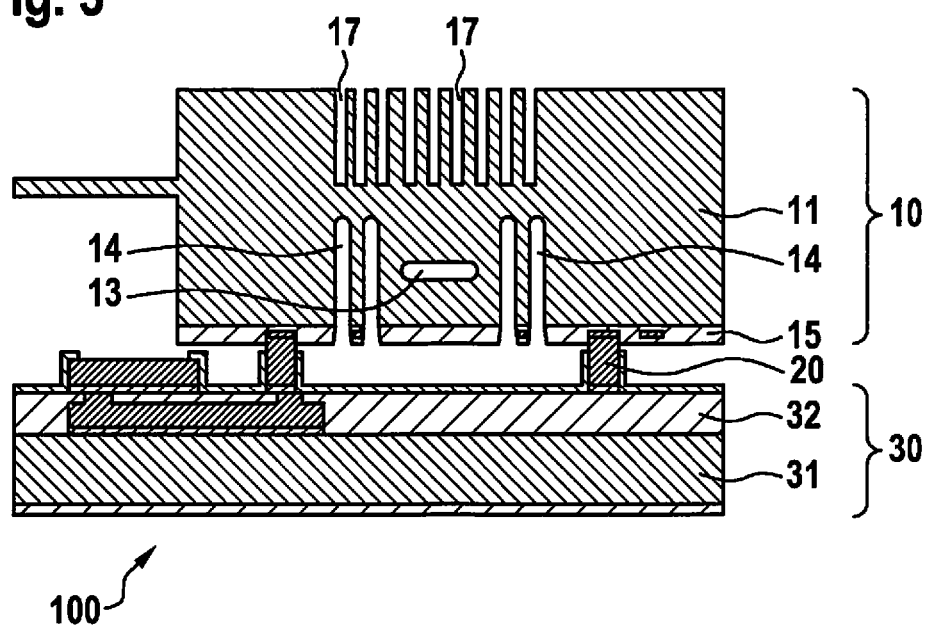

FIG. 3 shows a cross-sectional view through the two bonded wafers 10, 30. In a next step, a hole pattern is produced in silicon substrate 11 using photolithography. The mentioned hole pattern is subsequently etched, preferably with the aid of a perpendicular or anisotropic etching process, preferably in the form of a deep reactive ion-etching process (DRIE). This creates second access openings 17 in silicon substrate 11. The etching of second access openings 17 stops in the bulk silicon of silicon substrate 11. This patterning step may also be used to produce large-scale etched opening in other regions, which, for instance, create an access to bonding regions (bondlands) or dicing channels.

In the further course, underetching at the base of second access openings 17 using non-directional or isotropic further etching is achieved by switching off the passivation and sputter component in the mentioned DRIE etching process. A region having blind holes is thereby turned into a free-standing grid without mechanical contact to the sensor core. A wire-bonding or dicing channel region is able to be exposed in this step through etching.

Figure 4:
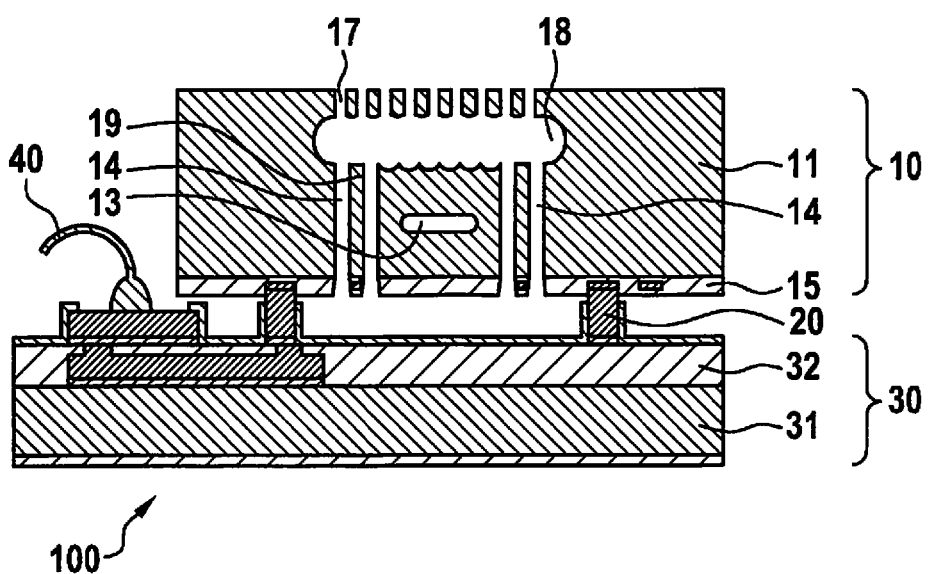

FIG. 4 shows a consequence of the mentioned modified etching regime during the development of second access openings 17. It can be seen that due to the modified etching parameters, spherical etching fronts in silicon substrate 11 have now grown together and thus form a second cavity 18. Second cavity 18 is separated from the rest of the substrate by a grid which was developed in silicon substrate 11 by first access openings 17. The pressure sensor core is connected to the rest of the substrate with the aid of springs 19, which have electrical leads (not shown).

As a result, due to the now uninterrupted first access openings 14, second cavity 18, and uninterrupted second access openings 17 are free-standing on all sides, which means that a mechanical decoupling structure for sensor diaphragm 12 to counteract externally acting mechanical stress is created. Apart from electrical accesses and a mechanical fastening of the pressure sensor core, this ensures a mechanical decoupling of the pressure sensor core on all sides in order to minimize mechanical influences from the chip edge on the pressure sensor core in an advantageous manner.

Diameters of second access openings 17 are preferably dimensioned in such a way that suitable access ducts are created for media access to the pressure sensor. Second access openings 17 therefore also realize an effective protection of the pressure sensor core from particles and/or moisture (e.g., due to spray water).

Thus, the cavity in the form of second cavity 18 required for the mentioned structure has been produced in an uncomplicated manner with the aid of an etching process using etching parameters that were modified during the process execution. It can be gathered that partially spherical areas have been developed within second cavity 18 as a result of the isotropic etching phase.

Figure 5:
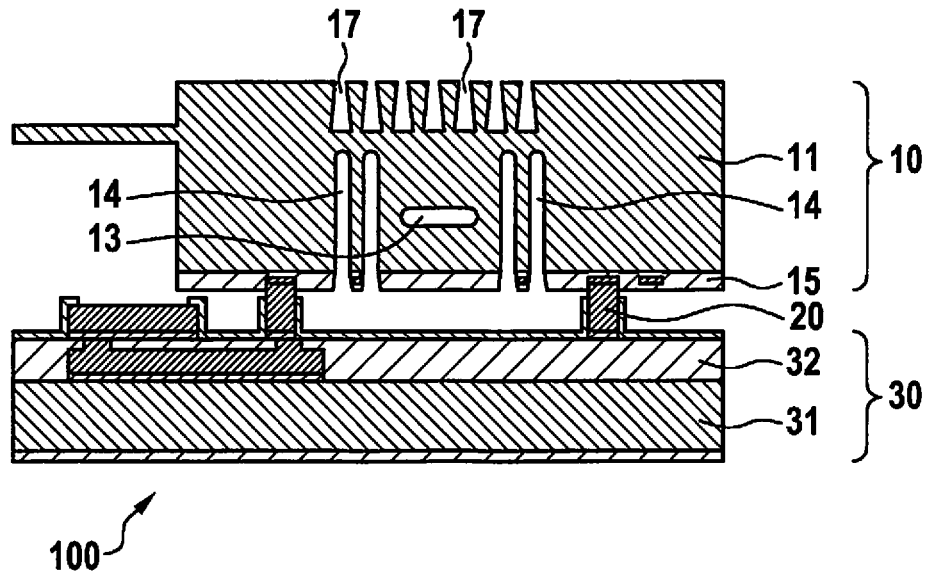
FIGS. 5-6 show cross-sectional views to illustrate an alternative method for producing a micromechanical pressure sensor.

FIG. 5 shows a cross-sectional view through a micromechanical pressure sensor 100, which was produced according to an alternative method. It is clear that in this case second access openings 17 are developed with uniformly widening etching fronts, which widen in a trapezoidal fashion from the surface of silicon substrate 11 in the downward direction. This is achievable by controlling the aforementioned DRIE process in such a way that individual etching fronts, which are defined by second access openings 17 on the substrate rear side, come together in the course of the process and separate the pressure sensor core from the rear side or the topside of silicon substrate 11 in the form of a uniform etching front.

Figure 6:
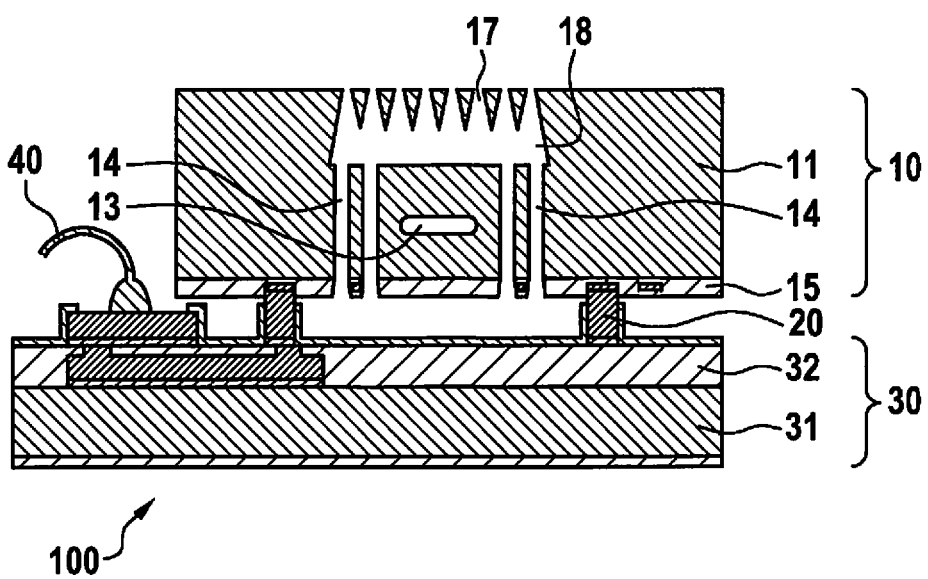

As may be gathered from FIG. 6, this has the result that second cavity 18 is formed by the trapezoidal etching fronts with respect to the surface of silicon substrate 11 and the side. Etching gases may ultimately be introduced more easily in this way and the entire etching process is able to be controlled in an advantageous manner.

Figure 7:
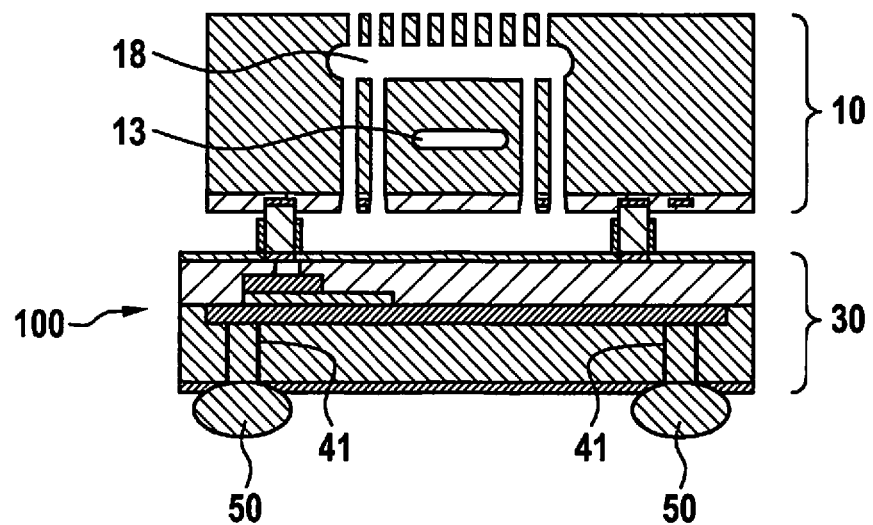
FIGS. 7-8 show possible finishing treatments of the introduced micromechanical pressure sensor.
Figure 8:
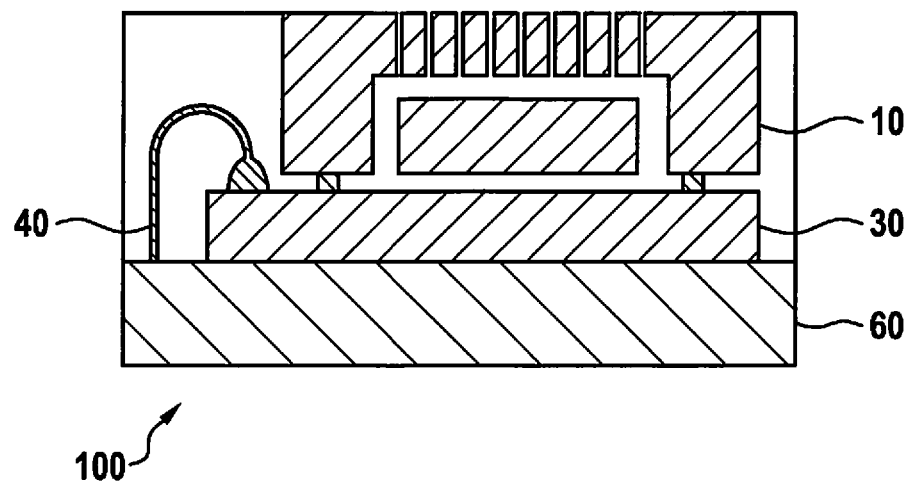

FIGS. 7 and 8 show results of the subsequent final processing steps for micromechanical pressure sensor 100. FIG. 7 sketches an electrical connection of micromechanical pressure sensor 100 with the aid of an electrical through hole 41 and solder balls 50.

FIG. 8 shows a micromechanical pressure sensor 100 which is extrusion-coated by a molding mass, thereby providing a stable and robust housing for micromechanical pressure sensor 100. A stress-decoupled pressure sensor having a cost-effective first wafer 10 including a silicon substrate 11 is advantageously made available in this manner. The use of cost-intensive substrates, e.g., in the form of an SOI substrate for first MEMS wafer 10, is therefore not required. This advantageously makes it possible to realize cost advantages during the production of a stress-decoupled micromechanical pressure sensor.

Micromechanical pressure sensor 100 is preferably developed as a piezoresistive pressure sensor, but a realization as a capacitive micromechanical pressure sensor is also possible.

FIG. 9 shows a basic sequence of a method for producing a micromechanical pressure sensor 100.

In a step 200, a MEMS wafer 10 is provided, which has a silicon substrate 11 and a first cavity 13 developed therein underneath a sensor silicon diaphragm 12.

In a step 210, a second wafer 30 is provided.

In a step 220, bonding of MEMS wafer 10 to second wafer 30 is carried out.

Finally, in a step 240, a sensor core 12, 13, 13a is exposed from the rear side, and a second cavity 18 is thereby formed between sensor core 12, 13, 13a and the surface of silicon substrate 11, second cavity 18 being developed with the aid of an etching process which is carried out using etching parameters that are modified in a defined manner.

In summary, the present invention provides a method for producing a micromechanical pressure sensor by which a stress-decoupling structure is able to be made available in a cost-effective manner. This is achieved by modifying an etching regime during a development of a second cavity within the first wafer above the pressure sensor diaphragm.

Although the present invention has been described on the basis of specific application examples in the previous text, one skilled in the art is also able to realize embodiments of the present invention that have not been described or only partially described in the preceding text without departing from the core of the present invention.

What is claimed is:

1. A method for producing a micromechanical pressure sensor, the method comprising:

providing a MEMS wafer having a silicon substrate and a first cavity developed therein underneath a sensor diaphragm;

providing a second wafer;

bonding an underside of the MEMS wafer to a topside of the second wafer; and exposing a sensor core having bulk silicon, the sensor diaphragm and the first cavity from a topside of the MEMS wafer, in the process forming a second cavity between the sensor core and the surface of the silicon substrate, the second cavity being formed using an etching process, which is carried out using etching parameters that are modified in a defined manner in comparison with etching parameters used to develop access holes to the second cavity.

2. The method as recited in claim 1, wherein the etching process for developing the second cavity is a deep reactive ion-etching process having an anisotropic beginning and a defined isotropic continuation.

3. The method as recited in claim 1, wherein access openings are created in the silicon substrate for development of the second cavity using a perpendicular etching process, the perpendicular etching process being changed to a lateral etching process, and spherical etching fronts resulting from the lateral etching process growing together.

4. The method as recited in claim 2, wherein a passivation and sputter component of the etching process is switched off following the deep reactive ion-etching process.

5. The method as recited in claim 1, wherein the entire etching process has a defined isotropic development from the beginning.

6. The method as recited in claim 5, wherein trapezoidal etching fronts that widen in a downward direction are formed using the etching process.

7. The method as recited in claim 1, wherein the second wafer is a passive substrate wafer or an ASIC wafer.

8. The method as recited in claim 1, wherein the micromechanical pressure sensor is a piezoresistive pressure sensor or a capacitive pressure sensor.

9. A micromechanical pressure sensor, comprising:

a MEMS wafer having a silicon substrate and a first cavity developed therein underneath a sensor diaphragm;

a second wafer which is bonded to the MEMS wafer at an underside of the MEMS wafer;

a sensor core developed in a silicon substrate having bulk silicon and a sensor diaphragm, a first cavity being developed in the sensor diaphragm;

a second cavity developed in the silicon substrate above the sensor core, the second cavity having been produced with the aid of an etching process whose etching parameters were modified in a defined manner in comparison with etching parameters that were used to develop access openings into the second cavity.

10. The micromechanical pressure sensor as recited in claim 9, wherein in order to form the second cavity, the micromechanical pressure sensor was developed with the aid of a deep reactive ion-etching process having an isotropic beginning and a defined isotropic continuation.

11. The micromechanical pressure sensor as recited in claim 10, wherein the second cavity of the micromechanical pressure sensor is a piezoresistive or a capacitive pressure sensor.

* * * * *